United States Patent [19]
Abe et al.

[11] 4,149,269
[45] Apr. 10, 1979

[54] HOLOGRAPHIC READING APPARATUS WITH AN AREA IDENTIFICATION AND DENSITY REFERENCE SCAN

[75] Inventors: Michiharu Abe; Hiroyoshi Funato, both of Tokyo, Japan

[73] Assignee: Ricoh Co., Ltd., Tokyo, Japan

[21] Appl. No.: 837,493

[22] Filed: Sep. 28, 1977

[30] Foreign Application Priority Data

Sep. 29, 1976 [JP] Japan ............................ 51-116899
Dec. 1, 1976 [JP] Japan ............................ 51-143515

[51] Int. Cl.² .................. G11C 7/00; G11C 8/00; G11C 13/04
[52] U.S. Cl. .................. 365/215; 35/48 B; 235/455; 365/234
[58] Field of Search ............ 365/120, 125, 127, 215, 365/216, 234, 235; 350/3.5; 235/457, 455; 35/48 B; 250/569, 570

[56] References Cited

U.S. PATENT DOCUMENTS

| | | | |
|---|---|---|---|
| 2,295,000 | 9/1942 | Morse | 365/127 |
| 3,072,889 | 1/1963 | Willcox | 365/127 |
| 3,229,047 | 1/1966 | Simpson | 365/234 |
| 3,290,987 | 12/1966 | James et al. | 88/24 |
| 3,882,468 | 5/1975 | Ormsby | 365/120 |
| 3,887,276 | 6/1975 | Clay et al. | 365/125 |

*Primary Examiner*—Stuart N. Hecker
*Attorney, Agent, or Firm*—Frank J. Jordan

[57] ABSTRACT

A large number of closely spaced holograms are formed on a sheet, each hologram comprising an information portion and an identification portion. First scan means movably position the sheet relative to a reconstruction beam and a sensor means for reading a selected hologram. The sensor means reads the identification portion of the reconstructed hologram to determine whether said hologram is the selected hologram. If said hologram is the selected hologram, a second scan means is actuated to read the information area. If said hologram is not the selected hologram, the first scan means is actuated to move to the next hologram. The process is continued until the selected hologram is located. The identification area further comprises a density reference section which is read to produce a bias reference signal for combination with the information signals. In digital applications the bias reference signal establishes the quantization threshold. In analog applications the bias reference signal establishes the bias point for differential amplification.

7 Claims, 19 Drawing Figures

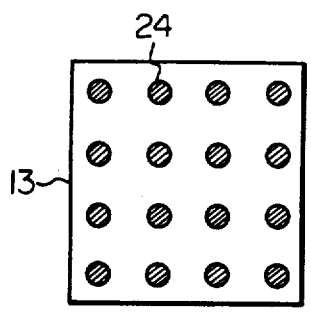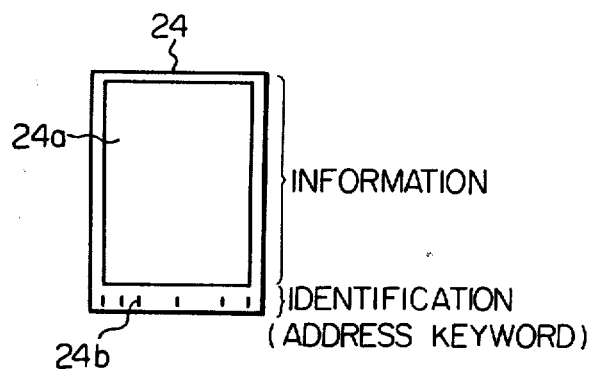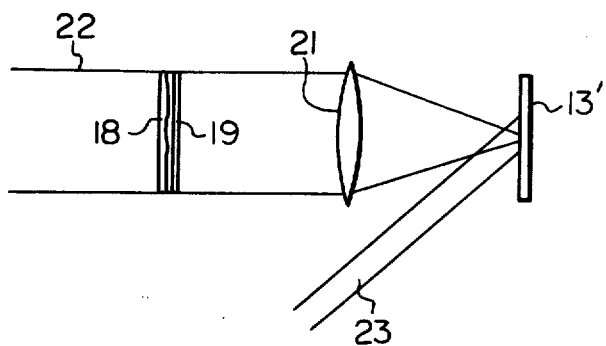

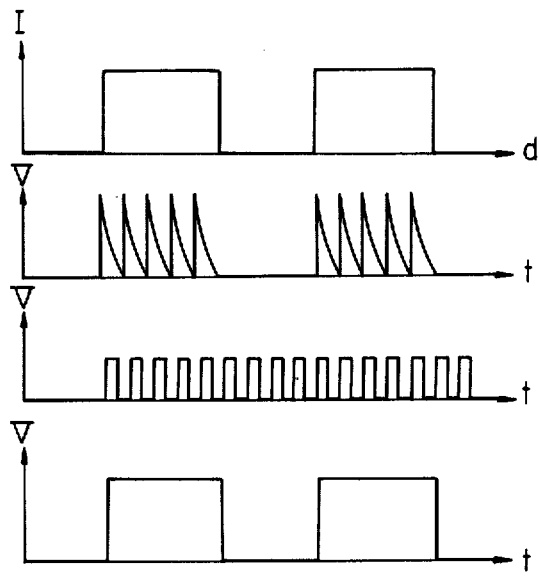
Fig. 5a
Fig. 5b
Fig. 5c
Fig. 5d
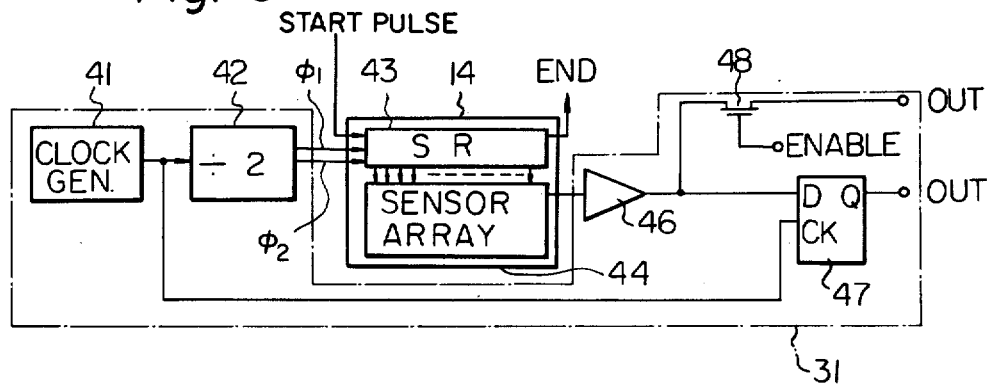
Fig. 6

HOLOGRAPHIC READING APPARATUS WITH AN AREA IDENTIFICATION AND DENSITY REFERENCE SCAN

BACKGROUND OF THE INVENTION

The present invention relates to an optoelectronic reading apparatus especially suited to Fourier or Fraunhaufer transform holography.

Fourier transform holography provides an advantageous means for recording a large amount of information in a small space. Generally, a large number of closely spaced holograms are formed on a sheet or plate and selectively reconstructed through illumination with a coherent reconstruction beam from a laser. The holograms may represent digital or analog information in two dimensional form. The analog information may be, for example, pictures, printed pages or the like.

A scan means is provided to move the sheet relative to the reconstruction beam and a sensor so that the selected or desired hologram is read. However, a major problem has limited the packing density of such holograms heretofore. The problem is that due to the close spacing of the holograms the scan means must operate with such precision as to render the reading apparatus economically unfeasible. More specifically, the sheet must be positioned with microinch precision to ensure that the selected hologram is in the reading position.

Another major problem has existed heretofore which has limited the resolution of Fourier transform hologram readers. Due to variations in the output of the laser which produces the reconstruction beam, the reconstruction efficiency of various holograms, temperature dependence of dark current in optoelectronic sensors and other effects, it has been excessively difficult to obtain high and stable resolving power of fine patterns. In digital applications, the quantization threshold varies in accordance with the parameters described above. If the quantization threshold is too high fine patterns will appear as unresolved dark areas. If the quantization threshold is too low the fine patterns will appear as unresolved light areas. This effect is compounded by the fact that the average image intensity of fine patterns is lower than that of coarse patterns due to the optical transfer function. In analog applications these variations cause incorrect bias and resulting loss of resolution.

In digital applications, it has been proposed to overcome this problem in high signal-to-noise ratio processing to integrate the output of a sensor which scans a predetermined area of the hologram having a pattern consisting of a predetermined number of bits of logically high or low information. This integrated value is compared with a predetermined value and the quantization threshold adjusted until equality is obtained. Although this method has practical application in digital systems, it cannot be used in analog applications.

SUMMARY OF THE INVENTION

The present invention overcomes the above problems of the prior art by providing each hologram with an identification portion in addition to the digital or analog information portion comprising an address keyword identifying the respective hologram. A sensor reads the address keyword and controls the scan means to search the sheet in a predetermined scan pattern until the selected hologram is located as evidenced by the address keyword.

The identification portion further comprises a density reference section which is read by a sensor to produce a bias reference signal. This signal is used to determine the quantization threshold in digital applications and the bias level in analog applications. The electrical characteristics of the sensor which reads the density reference section are the same as those of the sensor which reads the information portion.

It is an object of the present invention to provide an optoelectronic reading apparatus especially suited to Fourier or Fraunhaufer transform holography which overcomes the deficiencies of the prior art.

It is another object of the present invention to increase the packing density of holograms and provide means for positively locating a selected hologram.

It is another object of the present invention to increase the resolution of hologram reading.

It is another object of the present invention to stabilize the resolving power of hologram reading.

It is another object of the present invention to provide a generally improved holographic reading apparatus.

Other objects, together with the foregoing, are attained in the embodiments described in the following description and illustrated in the accompanying drawing.

BRIEF DESCRIPTION OF THE DRAWING

FIG. 2 is a diagram of a sheet or plate on which a plurality of holograms are formed;

FIG. 3 is a diagram showing the information and identification portions of each hologram;

FIG. 4 is a diagram showing the process of forming Fourier transform holograms;

FIGS. 5a to 5d are graphs illustrating electronic information conversion;

FIG. 6 is a block diagram of important portions of the apparatus;

DESCRIPTION OF THE PREFERRED EMBODIMENTS

While the holographic reading apparatus of the invention is susceptible of numerous physical embodiments, depending upon the environment and requirements of use, substantial numbers of the herein shown and described embodiments have been made, tested and used, and all have performed in an eminently satisfactory manner.

Figure 1:
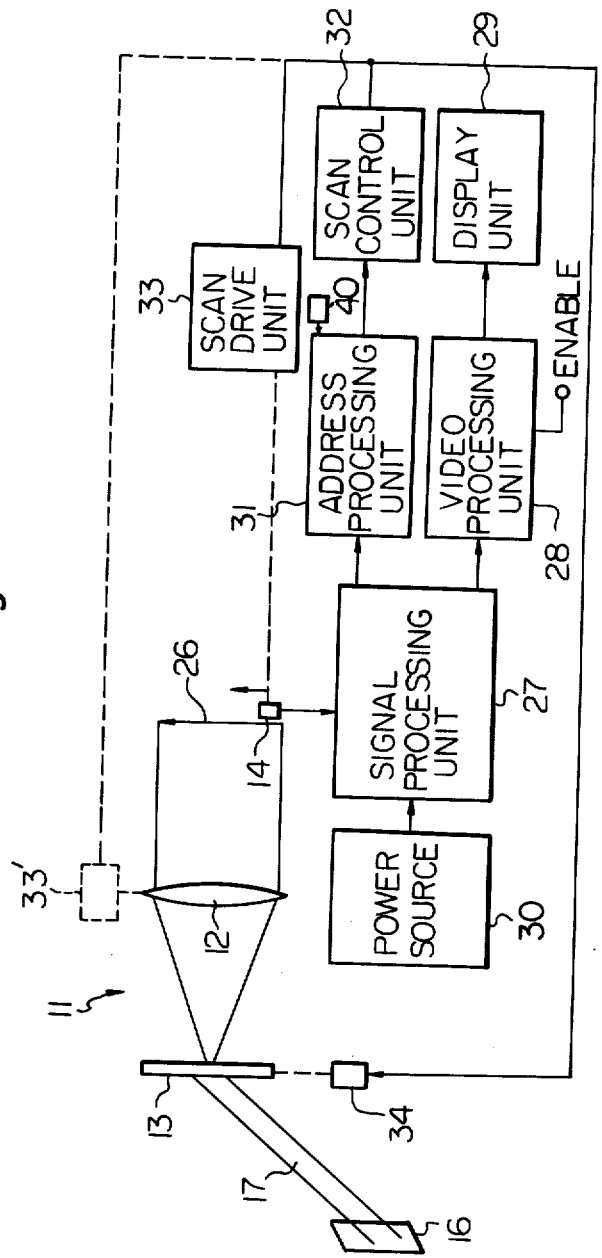
FIG. 1 is a partial block diagram of a holographic reading apparatus embodying the present invention.

Referring now to FIG. 1 of the drawing, a holographic reading apparatus embodying the present invention is partially shown and designated as 11. The apparatus 11 comprises an inverse Fourier transform or reconstruction lens 12 which is disposed between a hologram plate or sheet 13 and an optoelectronic sensor 14. A reconstruction beam 17 from a laser 16 illuminates the sheet 13.

The method of forming the sheet 13 is illustrated in FIG. 4. A transparency 19 is placed between a random phase or diffuser plate 18 and a Fourier transform lens 21. A coherent beam 22 from a laser (not shown) illuminates the transparency 19 through the random phase plate 18. The lens 21 focusses a light image of the transparency 19 onto the sheet 13 which is here designated as 13'. A coherent reference beam 23 from a laser (not shown) is radiated onto the sheet 13' at an angle.

The transparency 19 may contain digital data in the form of alternating transparent and opaque areas. The transparency 19 may also represent analog data such as pictures or printed pages. The reference beam 23 interferes with the light image from the lens 21 to form a hologram on the sheet 13' in the form of an optical interference pattern of fringes. The hologram features high redundancy and is not effected by damage such as abrasion of localized areas. The sheet 13' may be photographic, in which case the sheet 13' is developed after exposure. The sheet 13' may also be thermoplastic and the hologram formed by means of heating and cooling. The transparency 19 and sheet 13' are provided in the object and image focal planes respectively of the lens 21.

Although FIG. 4 illustrates the formation of only one hologram on the sheet 13' actually it is advantageous to form a number of holograms thereon in a closely spaced pattern. This is illustrated in FIG. 2 in which the sheet 13 is designated unprimed since it is completely formed. The holograms are designated as 24 (only one hologram 24 is designated for simplicity of illustration) and are arranged in a rectangular pattern. A large number of holograms 24 are formed on the sheet 13 by forming one hologram 24 and then replacing the transparency 19 with a different transparency and shifting the sheet 13' in its own plane to bring a new hologram position to the exposure position in a rectangular pattern. The sheet 13' is then exposed with a light image of the new transparency to form another hologram. The process is repeated until all of the holograms 24 are formed.

FIG. 3 shows the arrangement of each hologram 24 as comprising an information portion 24a and an identification portion 24b. The information portion 24a constitutes the digital or analog data of the hologram 24. The identification portion 24b comprises an address keyword which is shown as being constituted by a number of marks arranged in a code which distinguishes the holograms 24 from each other. The transparency 19 preferably comprises both the information and identification portions so that each hologram 24 is exposed in an integral manner.

Referring back to FIG. 1 it will be seen that the hologram reconstruction process is the reverse of the exposure process. The sheet 13 and sensor 14 are arranged in the object and image planes respectively of the lens 12. The sensor 14 is advantageously provided in the form of an array of optoelectronic sensing elements arranged in a row such as photodiodes, although not illustrated in detail. The width of the sensor 14 is typically equal to the width of the optical image of the hologram 24 formed by the lens 12, this image being symbolically indicated by an arrow 26. The sensing elements are enabled or strobed in sequence so as to effect horizontal scan of the hologram 24. More specifically, when enabled the sensing elements produce electrical signals corresponding to the intensity of the portion of the light image incident thereon. These signals are fed to a signal processing unit 27 which processes the signals in a manner which will be described in detail below. A power source 30 is shown for the signal processing unit 27. The output of the signal processing unit 27 is fed to a video processing unit 28 which applies the signals to a display unit 29 such as a cathode ray tube to display the holographic information.

The output of the signal processing unit 27 is also applied in modified form to an address processing unit 31 which has an output connected to a scan control unit 32. The output of the scan control unit 32 is applied to a scan drive unit 33. The purpose of the scan drive unit 33 is to move the sensor 14 in a direction perpendicular to the row of sensing elements in a synchronized manner to effect vertical scan of the hologram 24.

The output of the scan control unit 32 is also applied to another scan drive unit 34 which is used to position the sheet 13 relative to the reconstruction beam 17, lens 12 and sensor 14. Whereas the scan drive unit 33 is used to scan an individual hologram 24, the scan drive unit 34 positions the sheet 13 in a plate perpendicular to the optical axis of the lens 12 for selecting the particular hologram 24 which is desired to be reconstructed. The scan drive unit 34 is constructed to scan the sheet 13 in the same rectangular pattern which was used to form the holograms 24.

In operation, the address keyword of the selected hologram 24 is entered into the address processing unit 31 through a keyboard or the like (not shown). The scan control unit 32 controls the scan drive unit 33 to move the sensor 14 to a position to read the identification portion 24b of the hologram 24. The address keyword is typically one dimensional, as is the sensor 14, although the information portion 24a of the hologram 24 is two dimensional. The scan control unit 32 also controls the scan drive unit 34 to move sheet 13 to a position at which the selected hologram 24 is in a predetermined reading position so as to be illuminated by the reconstruction beam 17 and be read by the sensor 14.

The signal processing unit 27 then controls the sensor 14 to read the address keyword of the hologram 24 in the reading position, and the address processing unit 31 compares the address keyword with the address keyword of the selected hologram to see if they are the same. If the address keywords match, indicating that the hologram 24 in the reading position is indeed the selected hologram, the address processing unit 31 feeds a signal to the scan control unit 32 indicating the same. The scan control unit 32 then controls the scan drive unit 34 to hold the sheet 13 in position and controls the scan drive unit 33 to move the sensor 14 vertically to scan the image 26 and thereby read the selected hologram 24. A signal is applied to an enable input of the video processing unit 28 causing the output signals from the sensor 14 to be gated to the display unit 29.

As mentioned hereinabove, the holograms 24 are formed in a very closely packed arrangement on the sheet 13 and are provided in a very large number. Thus, due to the limited accuracy of a reasonably priced mechanical scan drive unit 34 it is quite probable that the scan drive unit 34 will move the wrong hologram 24 into the reading position. More specifically, the hologram 24 in the reading position will be spaced from the selected hologram by a maximum distance which can be calculated once the accuracy of the scan drive unit 34 is determined. In such a case, the address processing unit 31 will determine through comparison of the address keywords that the wrong hologram 24 is being read. In this case, the scan control unit 32 will control the scan drive unit 34 to execute a scan or search pattern to locate the selected hologram 24. The search pattern will be rectangular and will center about the initially incorrectly selected hologram 24. The search pattern will cover the maximum distance the selected hologram may be spaced from the incorrectly selected hologram 24 in two dimensions with, preferably, a safety factor added to the maximum distance. The search pattern is executed in increments equal to the spacing between adjacent holograms 24. As each new hologram 24 is moved into the reading position, the address keyword is read to determine if the selected hologram is being read. It the selected hologram 24 is found, the search will be terminated and the hologram 24 read. The search will be continued under control of the scan control unit 32 until the selected hologram 24 has been located, at which time the search or scan will be terminated and the selected hologram 24 read.

It will be understood that the present invention allows perfect selection of holograms utilizing a relatively inexpensive mechanism regardless of the packing density of the holograms. This allows increased packing density and greater information storage efficiency.

Although the sensor 14 is illustrated as being moved relative to the lens 12 for scanning the selected hologram 24, the sensor 14 may be held stationary and the lens 12 moved by a scan drive unit 33' which is indicated in broken line. It will be further understood that rather than moving the sheet 13, the scan drive unit 34 may be adapted to shift the reconstruction beam 17 relative to the sheet 13 in a parallel or non-parallel manner. As yet another alternative, a translating or rotating mirror or prism may be provided between the reconstruction beam 17 and sheet 13 to adjustably deflect the reconstruction beam 17.

To ensure reliable reading of the address keyword, the individual marks are preferably made large enough that the images thereof are larger than the distance between adjacent sensing elements of the sensor 14. As a typical example, the marks may be as wide as the distance between five sensing elements. This is illustrated in FIGS. 5a to 5d. FIG. 5a illustrates the intensity I of the address keyword as a function of displacement d along the hologram 24. FIG. 5b illustrates the voltage V produced by the outputs of the corresponding sensing elements of the sensor 14 as a function of time t. It will be seen that the bright marks of the address keyword produce electrical signals in the form of five positive spikes each. It is extremely inconvenient to attempt to read the address keyword in this form.

To overcome this problem, the present invention provides the address processing unit 31 with a clock generator 41 which produces clock pulses which are illustrated in FIG. 5c. A frequency divider 42 divides these clock pulses by a factor of two and produces output pulses $\phi_1$ and $\phi_2$ which have half the frequency of the clock pulses and are 180° out of phase relative to each other. These output signals are applied to shift inputs of a shift register 43 which is part of the sensor 14. A start pulse is also applied to the shift register 43 which is ultimately shifted out of the shift register 43 as an end pulse. The parallel outputs of the shift register 43 are applied to the individual sensing elements (not shown) of the sensor array of the sensor 14 which is here designated as 44. The outputs of the sensing elements are connected in a bus arrangement which is not shown in detail so that only the sensing element which is enabled produces an output. The paralleled outputs of the sensor array 44 are fed through an amplifier 46 to the D input of a D-type flip-flop 47. The clock pulses from the clock pulse generator 41 are applied to the clock input CK of the flip-flop 47. The Q output of the flip-flop 47 produces signals illustrated in FIG. 5d corresponding to the marks shown in FIG. 5a as will be described in detail below.

Scanning is initiated by feeding the start pulse into the shift register 43. With the logically high start pulse in the first stage of the shift register 43, the high first stage output of the shift register 43 is applied to the corresponding first sensing element of the sensor array 44 thereby enabling the first sensing element which produces an output signal which is applied to the D input of the flip-flop 47. More specifically, the $\phi_1$ pulse is used to cause the shift register 43 to shift and the $\phi_2$ pulse is used to enable the parallel outputs. This provides positive action of the circuitry. The next $\phi_1$ pulse causes the shift register 43 to shift and the start signal to be shifted to the next stage. The next $\phi_2$ pulse enables the parallel outputs of the shift register 43 thereby applying the high second stage signal to the second sensing element of the sensor array 44 thereby enabling the same. The second sensing element thus produces an output signal. In this manner, the sensing elements of the sensor array 44 are enabled in sequence.

In response to a high output signal from the array 44, if the flip-flop 47, which is a bistable device, was in the low state, the flip-flop 47 will be changed over to the high state. The flip-flop 47 produces logically high and low output signals at the Q output when the states thereof are high and low respectively. More specifically, in response to a clock pulse at the CK input, the flip-flop 47 assumes the logical state indicated by the signal at the D input. Thus, when the D input is high and the state of the flip-flop 47 is low, the next clock pulse will cause the flip-flop 47 to change over to the high state. However, if the flip-flop 47 was already in the high state, no change will occur. In response to a low output signal from the sensor array 44 applied to the D input, the opposite effect occurs. If the flip-flop 47 were already in the low state no change will occur. However, if the flip-flop 47 was in the high state it will change to low.

Comparing FIGS. 5b and 5b, it will be seen that the flip-flop 47 is changed to high by the first high output signal from the sensor array 44 and remains high until the sensor array 44 produces a low signal. Then, the flip-flop 47 is changed over to low and remains low until receipt of another high signal. In this manner, the output of the flip-flop 47 corresponds to the intensity of the marks of the address keyword and greatly simplifies reading of the address keyword. The output of the flip-flop 47 is applied to other portions of the address processing unit 31 which are not the subject matter of the present invention and are not shown in detail. A gate 48 feeds the output of the amplifier 46 to the video processing unit 28 in response to the enable signal applied to a gate terminal thereof. An indicator 40 indicates the status of the address processing unit 31.

Figure 7:
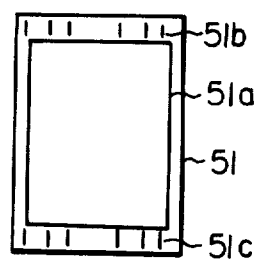
FIG. 7 is a diagram illustrating an alternative arrangement of information and identification portions of each hologram.

Although the sensor array 14 has been described as being in the form of a linear array, it may be in the form of a two-dimensional array which greatly increases the scan speed. For low cost applications, however, the sensor 14 may be in the form of a signal sensing element such as a photodiode. In this case, the sensing element is mechanically moved in two dimensions for scanning. As illustrated in FIG. 7, the speed of scanning the identification portion may be doubled where horizontal mechanical scan is utilized. A hologram 51 comprises an information portion 51a as described above. However, the identification portion comprises two address keywords 51b and 51c provided on opposite sides of the information area 51a. Although the address keywords 51b and 51c are identical, they are written backwards relative to each other. Thus, a one dimensional sensor will produce the same output signals reading the address keyword 51b from left to right or reading the address keyword 51c from right to left. This eliminates the time required for the sensor to return to an initial position after a scan.

Figure 9A:
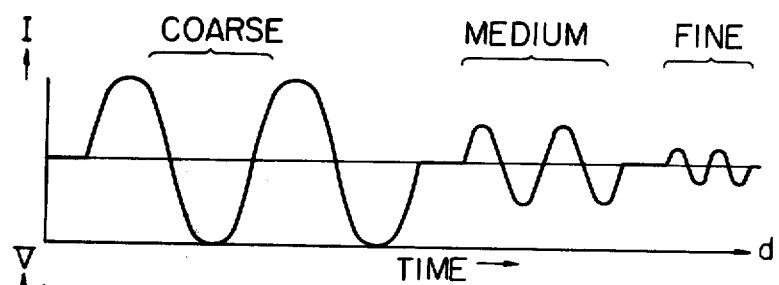
FIGS. 9a to 9c are graphs illustrating electronic conversion of digital holographic information or data.
Figure 9B:
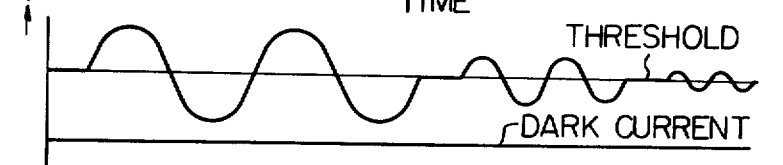
Figure 9C:
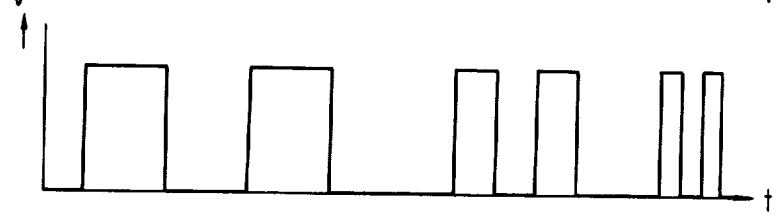

FIGS. 9a to 9c illustrate another problem which has existed heretofore in the prior art but is overcome by the present invention. FIG. 9a shows the intensity of various sinusoidal interference fringe patterns as a function of displacement along the hologram. It will be seen that the intensity of a coarse pattern is greater than the intensity of a fine pattern. This is due to the optical transfer function and is common to other optical devices besides holographic apparatus. FIG. 9b illustrates the output signals of a sensor scanning the pattern of FIG. 9a. The output signals are added to a D. C. component which corresponds to the dark current of a typical photodiode sensor. If a quantization threshold is taken as the average value of the A. C. component, digital quantization of the signals of FIG. 9b will produce the signals illustrated in FIG. 9c.

Due to the effects described hereinabove, the intensity of the signals as well as the dark current will vary with time. In the case of the dark current, the major variation is caused by temperature. Variation of either or both of the A. C. and D. C. components will shift the peak value of the waveform relative to the threshold. Whereas the effect may be tolerated with coarse patterns (large amplitude), fine patterns may be completely lost. If the entire waveform is below the quantization threshold, the pattern will appear as an unresolved dark area. If the entire waveform is above the threshold, the pattern will appear as an unresolved light area. Although coarse patterns will not be completely lost due to their large amplitude (they will be distorted), fine patterns may be completely lost. This results in instability of the resolving power of the holographic apparatus and limits the reliable resolving power thereof to an unnecessary extent.

Figure 8:
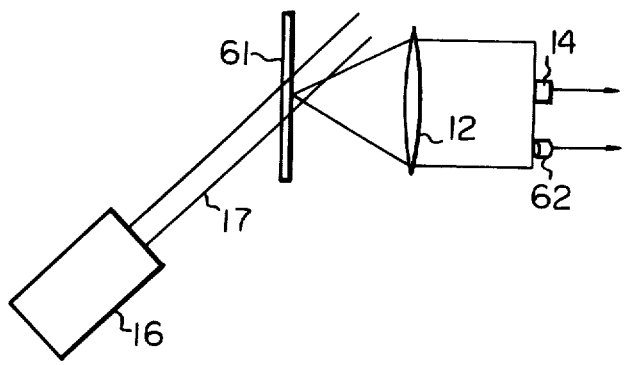
FIG. 8 is a diagram illustrating the reading of information and density reference areas of a hologram.
Figure 10:
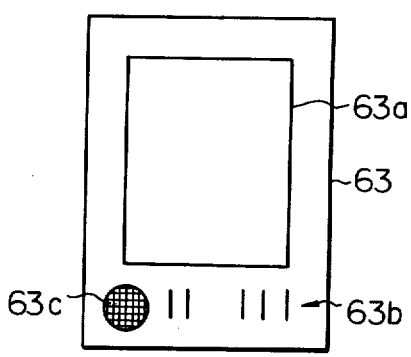
FIG. 10 is a diagram illustrating the arrangement of address keyword and density reference sections of each identification portion.

FIG. 8 shows how this problem is overcome in accordance with the present invention, in which like elements are designated by the same reference numerals. Here, the hologram sheet is designated as 61 and another sensor 62 is provided to read a density reference sention 63c of a hologram 63 formed on the sheet 61 (see FIG. 10). The identification portion of the hologram 63 comprises, in addition to the density reference section 63c, an address keyword 63b. The information portion 63a of the hologram 63 is the same as described above.

Figure 11:
FIGS. 11 and 12 are diagrams illustrating alternative patterns of the density reference sections.
Figure 12:

During the time in which the sensor 14 is reading the address keyword 63b, the sensor 62 is reading the density reference section 63c which typically consists of a pattern of intersecting parallel lines. The spacing between adjacent lines is such that the spacing between the images of the lines is smaller than the smallest dimension of the light receiving area of the sensor 62. Preferably, it is much smaller. The spacing between the lines, or the corresponding spatial frequency of the pattern, is selected to correspond to the mean spatial frequency of the type of pattern formed on the hologram 63. The pattern of the density reference section 63b is shown in enlarged form in FIG. 11. As shown in FIG. 12, the pattern may comprise only one set of parallel lines as designated at 63c'.

Figure 14:
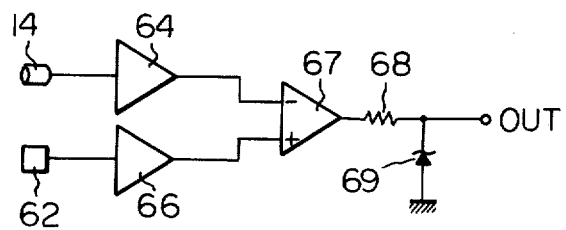
FIG. 14 is an electrical schematic diagram of a portion of the apparatus utilized to generate and process a bias reference signal.

The output signals of the sensors 14 and 62 are applied to inputs of amplifiers 64 and 66 as illustrated in FIG. 14. The outputs of the amplifiers 64 and 66 are applied to inverting and non-inverting inputs of an operational amplifier connected as a comparator 67. The output of the comparator 67 is grounded through a resistor 68 and a zener diode 69.

The sensors 14 and 62 are selected to have identical electrical characteristics. Therefore, the output of the sensor 62 corresponds to the intensity of the density reference section 63c added to the dark current of the sensor 62. The dark current of the sensor 14 is identical to that of the sensor 62 and the sensor 14 is influenced by intensity variations in the same manner as the sensor 62. Thus, the output of the sensor 62 will be the average value of the A. C. component of the output of the sensor 14 under all conditions. The output of the sensor 62 is therefore used to set the quantization threshold of the comparator 67 since it is applied to the non-inverting input thereof.

Where the amplitude of the output signal of the sensor 14 is higher than the amplitude of the output signal of the sensor 62, the comparator 67 will produce a positive output. The resistor 68 and zener diode 69 act as a series regulator to limit the output of the comparator 67 to a suitable constant value. When the output signal of the sensor 14 is below the amplitude of the output signal of the sensor 62, the comparator 67 will produce a low output. This action produces the signals shown in FIG. 9c from the signals shown in FIG. 9b in a precise manner.

It will be understood that the automatic biasing action of the sensor 62 prevents loss of fine patterns since it maintains the quantization threshold at precisely the average A. C. value of the output signals from the sensor 14. Although the pattern of the density reference portion 63c has been described as being sinusoidal, it may be made rectangular for ease of manufacture without significant loss of effectiveless. It will thus be seen that the output signal of the sensor 62 constitutes a bias reference signal. While the comparator 67 is utilized in digital applications, it may be replaced by a differential amplifier in analog applications, in which case the bias reference signal establishes the bias point.

The pattern of the density reference section 63c may be modified in a number of ways. For example, it may be a random pattern having a predetermined average spatial frequency. It may furthermore have an average spatial frequency corresponding to maximum or minimum spatial frequencies of the information portion 63a. It may furthermore be a blank area, with a filter provided (not shown) to reduce the image intensity.

It is further possible to utilize the sensor 14 for reading the density reference section 63c if a memory means (not shown) is provided. In this case, the sensor 14 would be used to read the density reference signal which would be stored in an analog memory and used as the bias reference signal. The sensor 14 would then be used to read the address keyword. This system produces extremely small errors since the variations which effect the reading occur over relatively long periods of time.

Figure 13:
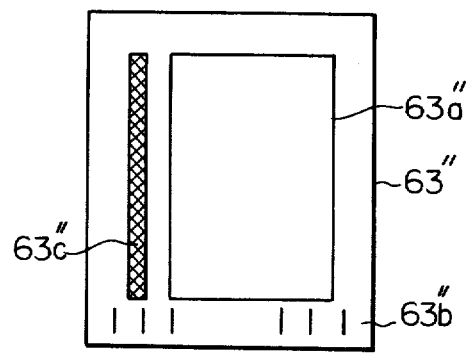
FIG. 13 is a diagram illustrating an alternative arrangement of the density reference section.

FIG. 13 shows a modification of the density reference section as being elongated to the length of the information portion, the corresponding elements being designated by the same reference numerals double primed. This modification allows the sensor 62 to produce the bias reference signal continuously to compensate for variations in intensity in the vertical dimension during scanning of the information portion 63c''.

In summary, it will be seen that the present invention provides greatly increased information storage density, resolving power and reliability although comprising low cost mechanism. Various modifications will become possible for those skilled in the art after receiving the teachings of the present disclosure.

What is claimed is:

1. An apparatus for reading a selected hologram of a plurality of holograms formed on a sheet, each hologram having an information portion and an identification portion, the apparatus comprising:
   reconstruction beam means for producing a reconstruction beam to form a reconstructed light image of one of the holograms;
   sensor means for reading the light image and thereby the hologram;
   first scan means for producing relative scanning movement between the reconstruction beam means, sheet and sensor means so that the holograms are sequentially moved to a predetermined position in the reconstruction beam and read by the sensor means;
   second scan means for producing relative scanning movement between the reconstruction beam means, sheet and sensor means for reading the information portion of a hologram in the predetermined position; and
   logical control means for controlling the sensor means, first scan means and second scan means in such a manner that the sensor means reads the identification portion of the hologram in the predetermined position and the logical control means determines whether the hologram in the predetermined position is the selected hologram, controls the first scan means to continue scanning if the hologram in the predetermined position is not the selected hologram and controls the second scan means to read the information portion of the hologram in the predetermined position if the hologram in the predetermined position is the selected hologram;
   the identification portion of each hologram comprising a density reference section, the sensor means being operative to read a light image of the density reference section of the hologram in the predetermined position and adjust a magnitude of a bias reference signal in accordance therewith;
   each density reference section comprising a pattern of lines, the sensor means comprising a sensor for reading the density reference section, spacings between adjacent lines being such that spacings between light images of said adjacent lines are smaller than a minimum dimension of a light receiving area of the sensor;
   the sensor means being constructed to combine electrical signals produced by reading the information area of the selected hologram with the bias reference signal and produce output signals in accordance therewith;
   the sensor means comprising comparator means receiving as inputs the electrical signals produced by reading the information area of the hologram and the bias reference signal, a quantization threshold of the comparator means corresponding to the bias reference signal.

2. An apparatus as in claim 1, in which the density reference section comprises two patterns of intersecting parallel lines.

3. An apparatus as in claim 1, in which the sensor means comprises first and second sensors for reading the information portion and density reference section respectively, the first and second sensors having substantially identical electrical characteristics.

4. An apparatus as in claim 1, in which the density reference section comprises a random pattern of lines having a predetermined average spacing.

5. An apparatus for reading a selected hologram of a plurality of holograms formed on a sheet, each hologram having an information portion and an identification portion, the apparatus comprising:
   reconstruction beam means for producing a reconstruction beam to form a reconstructed light image of one of the holograms;
   sensor means for reading the light image and thereby the hologram;
   first scan means for producing relative scanning movement between the reconstruction beam means, sheet and sensor means so that the holograms are sequentially moved to a predetermined position in the reconstruction beam and read by the sensor means;
   second scan means for producing relative scanning movement between the reconstruction beam means, sheet and sensor means for reading the information portion of a hologram in the predetermined position; and
   logical control means for controlling the sensor means, first scan means and second scan means in such a manner that the sensor means reads the identification portion of the hologram in the predetermined position and the logical control means determines whether the hologram in the predetermined position is the selected hologram, controls the first scan means to continue scanning if the hologram in the predetermined position is not the selected hologram and controls the second scan means to read the information portion of the hologram in the predetermined position if the hologram in the predetermined position is the selected hologram;
   the sensor means comprising an array of sensing elements arranged in a row, the second scan means producing relative scanning movement between the reconstruction beam means, sheet and array perpendicular to the row of sensing elements, the sensor means further comprising means for sequentially enabling the sensing elements;
   the identification portion of each hologram comprising a plurality of marks, thicknesses of reconstructed light images of the marks being greater than a spacing between adjacent sensing elements;

the sensing elements being constructed to, when enabled, produce logically high and low electrical signals in accordance with incident light intensity, the logical control means comprising bistable means responsive to the electrical signals and constructed to change state from logical low to high in response to a logically high signal preceded by a logically low signal and to change state from high to low in response to a logically low signal preceded by a logically high signal.

6. An apparatus for reading a selected hologram of a plurality of holograms formed on a sheet, each hologram having an information portion and an identification portion, the apparatus comprising:
   reconstruction beam means for producing a reconstruction beam to form a reconstructed light image of one of the holograms;
   sensor means for reading the light image and thereby the hologram;
   first scan means for producing relative scanning movement between the reconstruction beam means, sheet and sensor means so that the holograms are sequentially moved to a predetermined position in the reconstruction beam and read by the sensor means;
   second scan means for producing relative scanning movement between the reconstruction beam means, sheet and sensor means for reading the information portion of a hologram in the predetermined position; and
   logical means for controlling the sensor means, first scan means and second scan means in such a manner that the sensor means reads the identification portion of the hologram in the predetermined position and the logical control means determines whether the hologram in the predetermined position is the selected hologram, controls the first scan means to continue scanning if the hologram in the predetermined position is not the selected hologram and controls the second scan means to read the information portion of the hologram in the predetermined position if the hologram in the predetermined position is the selected hologram;
   the identification portion of each hologram being formed in two sections on opposite sides of the respective information portion, the sensor means being operative to read the two sections in opposite directions respectively.

7. An apparatus for reading a selected hologram of a plurality of holograms formed on a sheet, each hologram having an information portion and an identification portion, the apparatus comprising:
   reconstruction beam means for producing a reconstruction beam to form a reconstructed light image of one of the holograms;
   sensor means for reading the light image and thereby the hologram;
   first scan means for producing relative scanning movement between the reconstruction beam means, sheet and sensor means so that the holograms are sequentially moved to a predetermined position in the reconstruction beam means and read by the sensor means;
   second scan means for producing relative scanning movement between the reconstruction beam means, sheet and sensor means for reading the information portion of a hologram in the predetermined position; and
   logical control means for controlling the sensor means, first scan means and second scan means in such a manner that the sensor means reads the identification portion of the hologram in the predetermined position and the logical control means determines whether the hologram in the predetermined position is the selected hologram, controls the first scan means to continue scanning if the hologram in the predetermined position is not the selected hologram and controls the second scan means to read the information portion of the hologram in the predetermined position if the hologram in the predetermined position is the selected hologram;
   the identification portion of each hologram comprising a density reference section, the sensor means being operative to read a light image of the density reference section of the hologram in the predetermined position and adjust a magnitude of a bias reference signal in accordance therewith;
   each density reference section comprising a pattern of lines, the sensor means comprising a sensor for reading the density reference section, spacings between adjacent lines being such that spacings between light images of said adjacent lines are smaller than a minimum dimension of a light receiving area of the sensor;
   each density reference section having a length substantially equal to a length of the information portion of the respective hologram.

* * * * *